(12) United States Patent
Matero

(10) Patent No.: US 8,373,426 B2
(45) Date of Patent: Feb. 12, 2013

(54) METHOD AND ARRANGEMENT FOR INDICATING CORRECT INSTALLATION OF PLUG-IN UNIT OF TELECOMMUNICATIONS DEVICE

(75) Inventor: Jari Matero, Masala (FI)

(73) Assignee: Tellabs Oy, Espoo (FI)

( * ) Notice: Subject to any disclaimer, the term of this patent is extended or adjusted under 35 U.S.C. 154(b) by 508 days.

(21) Appl. No.: 12/777,291

(22) Filed: May 11, 2010

(65) Prior Publication Data

US 2010/0295561 A1 Nov. 25, 2010

(30) Foreign Application Priority Data

May 22, 2009 (FI) ...................................... 20095565

(51) Int. Cl.
*G01R 27/26* (2006.01)
(52) U.S. Cl. .......................... 324/662; 324/671; 324/699
(58) Field of Classification Search .................... 324/662
See application file for complete search history.

(56) References Cited

U.S. PATENT DOCUMENTS

| 4,667,094 A | 5/1987 | Van-Hecke et al. |
| 5,530,302 A | 6/1996 | Hamre et al. |

FOREIGN PATENT DOCUMENTS

| JP | 2007-87072 | 4/2007 |
| JP | 2008-147286 | 6/2008 |

OTHER PUBLICATIONS

Finnish Search Report dated Dec. 28, 2009, from corresponding Finnish application.

*Primary Examiner* — Thomas Valone
(74) *Attorney, Agent, or Firm* — Young & Thompson

(57) ABSTRACT

An arrangement for indicating correct installation of a plug-in unit (102) of a telecommunications device includes at least one distance indicator (106) located in the plug-in unit and adapted to produce an indication for correct installation of the plug-in unit in response to a situation where the distance of the distance indicator from a wall (107) of the frame of the telecommunications device is smaller than a predetermined threshold value. The distance indicator, which may be e.g. an electromechanical limit switch or capacitive distance sensor, is adapted to produce the indication for correct installation without a need for a galvanically conducted electric current between the distance indicator and the frame of the telecommunications device. There is thus no need to make any electric circuit arrangements in the frame of the telecommunications device for the indication of correct installation of a plug-in unit.

20 Claims, 5 Drawing Sheets

METHOD AND ARRANGEMENT FOR INDICATING CORRECT INSTALLATION OF PLUG-IN UNIT OF TELECOMMUNICATIONS DEVICE

FIELD OF INVENTION

The invention relates to a method and arrangement for indicating correct installation of a plug-in unit of a telecommunications device. The invention also relates to a plug-in unit for a telecommunications device.

BACKGROUND OF INVENTION

Many telecommunications devices such as routers, bridges and switches are comprised of a frame of a telecommunication device and plug-in units installed in plug-in unit slots in said frame. Electric connectors in a plug-in unit make galvanic contacts with corresponding electric connectors in the frame when the plug-in unit is inserted in the plug-in unit slot in said frame. The frame may have wirings such that plug-in units installed in said frame form a full mesh network or such that plug-in units installed in said frame are connected to a central element of the telecommunications device which may comprise one or more plug-in units installed in said frame or which may be a functional component integrally built in said frame.

Certain care is needed in the installation of plug-in units in the frame of a telecommunications device because the galvanic contacts between the electric connectors of the plug-in unit and corresponding electric connectors of the frame may be poor, or even non-existent, if the plug-in unit is not properly seated in its place. In a prior-art solution, some pins in the electric connectors between the plug-in unit and the frame are shorter than other pins in said electric connectors. Those shorter pins are part of a test circuit for detecting whether the plug-in unit is installed in the plug-in unit slot in such a manner that said shorter pins make galvanic contacts in the electric connectors between said plug-in unit and said frame. If said shorter pins make the galvanic contacts it is practically certain that the longer pins in said electric connectors make adequate galvanic contacts in the electric connectors. The above-described prior-art arrangement for indicating correct installation of a plug-in unit is possible if the frame of the telecommunications device has got wirings belonging to the test circuit mentioned above. Often, however, there are no such wirings in the frame of a telecommunications device and the post-installation of such wirings would be expensive and difficult especially if said telecommunications device has been delivered to the telecommunications operator and is already in productive use.

SUMMARY

The invention is directed to a novel arrangement for indicating correct installation of a plug-in unit of a telecommunications device. An arrangement according to the invention comprises at least one distance indicator located in said plug-in unit and adapted to produce an indication for correct installation of said plug-in unit in response to a situation in which the distance of said distance indicator from a wall of the frame of said telecommunications device is smaller than a predetermined threshold value, where said distance indicator is capable of producing said indication without a need for a galvanically conducted electric current between said distance indicator and said frame of the telecommunications device.

Said predetermined threshold value is chosen such that when said distance indicator produces said indication, reliable galvanic contacts will have been formed in the electric connectors between said plug-in unit and said frame.

Said distance indicator may be e.g. an electromechanical limit switch adapted to produce said indication in response to a situation in which said plug-in unit is inserted so far towards the wall of the frame of the telecommunications device that reliable galvanic contacts will have been formed in the electric connectors between said plug-in unit and said frame. Said distance indicator may also comprise, for example, a capacitive distance sensor, magnetic distance sensor or a distance sensor based on a beam of light.

In an arrangement according to the invention there is no need to have electrical circuit arrangements in the frame of the telecommunications device for indicating correct installation of plug-in units. An arrangement according to the invention can thus also be used in conjunction with telecommunications devices in which there are no such electrical circuit arrangements in the frame.

The invention is also directed to a novel method for indicating correct installation of a plug-in unit of a telecommunications device. In a method according to the invention there is produced, using at least one distance indicator located in said plug-in unit, an indication for correct installation of said plug-in unit in response to a situation where the distance of said distance indicator from a wall of the frame of said telecommunications device is smaller than a predetermined threshold value, where said distance indicator is capable of producing said indication without a need for a galvanically conducted electric current between said distance indicator and said frame of the telecommunications device.

The invention is also directed to a novel plug-in unit for a telecommunications device. A plug-in unit according to the invention comprises at least one distance indicator adapted to produce an indication for correct installation of said plug-in unit in response to a situation where the distance of said distance indicator from a wall of the frame of said telecommunications device is smaller than a predetermined threshold value, where said distance indicator being capable of producing said indication without a need for a galvanically conducted electric current between said distance indicator and said frame of the telecommunications device.

The various embodiments of the invention are characterised by that which is specified in the dependent claims.

BRIEF DESCRIPTION OF DRAWINGS

Embodiments of the invention, presented by way of example, and their advantages will now be described in closer detail with reference to the accompanying Figures where.

DESCRIPTION OF EMBODIMENTS OF THE INVENTION

Figure 1A:
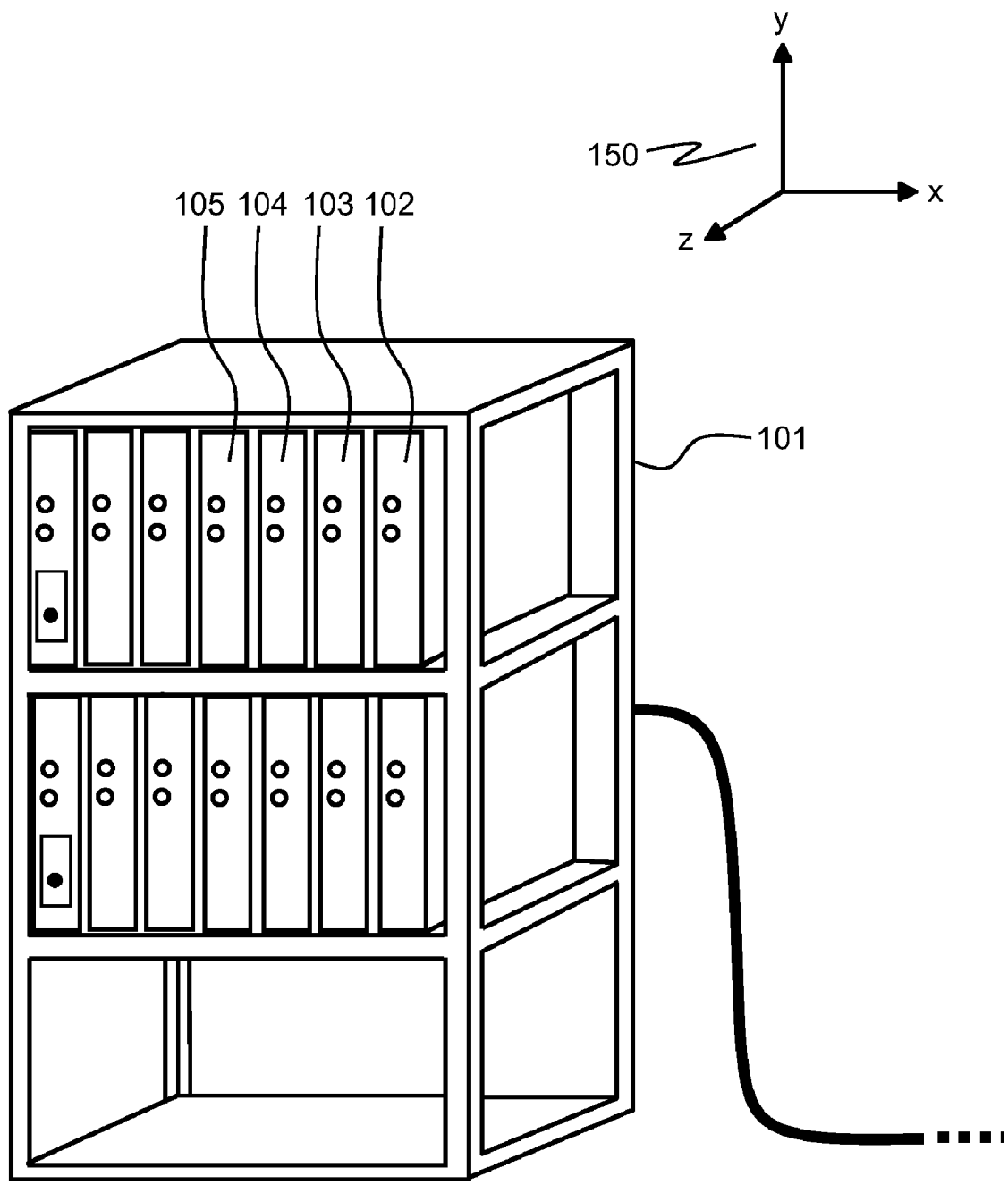
FIG. 1a shows a telecommunications device comprising a frame with plug-in units installed therein and an arrangement according to an embodiment of the invention for indicating correct installation of the plug-in units.

FIG. 1a shows a telecommunications device with a frame 101 and plug-in units installed therein, some of which are designated by numbers 102, 103, 104, and 105. Each plug-in unit is installed in the frame by pushing the plug-in unit in a plug-in unit slot in the frame in the negative z direction of the coordinate system 150. The frame may have, for example, wirings such that plug-in units installed in said frame form a full mesh network or such that plug-in units installed in said frame are connected to a central element of the telecommunications device which may comprise one or more plug-in units installed in said frame or which may be a functional component integrally built in said frame. Said wirings are typically located on the backplane of the frame.

Figure 1B:
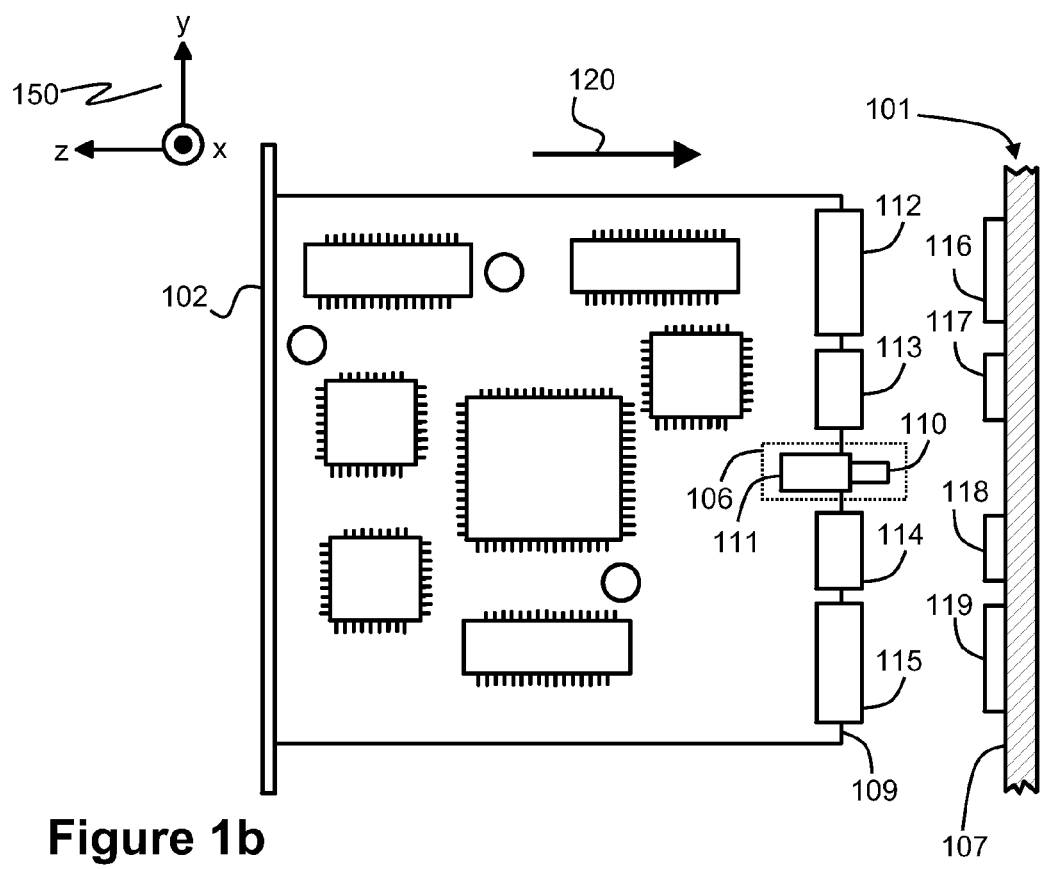
FIGS. 1b and 1c show a plug-in unit of the telecommunications device depicted in FIG. 1a and a detail of the frame of said telecommunications device.
Figure 1C:
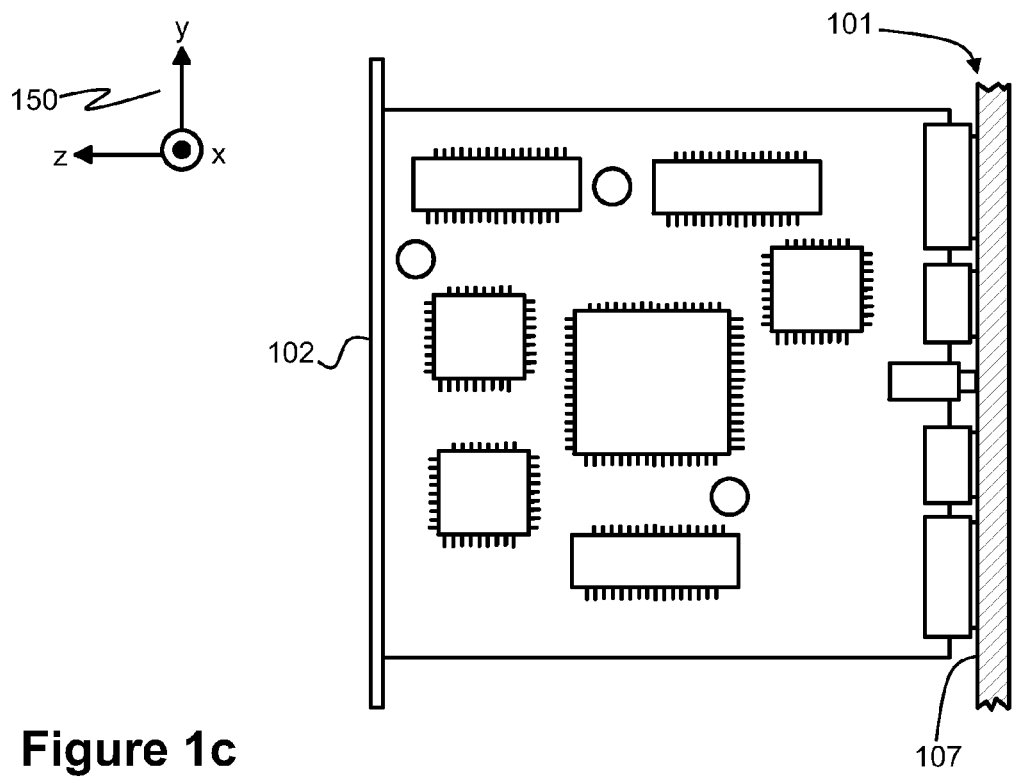

FIG. 1b shows a plug-in unit 102 of the telecommunications device depicted in FIG. 1a and a detail of the frame 101. In the plug-in unit 102 there are electric connectors 112, 113, 114, and 115 the contact parts of which make galvanic contacts with the contact parts of electric connectors 116, 117, 118, and 119 in the backplane of the frame when the plug-in unit 102 is inserted in its place along the direction of the arrow 120, i.e. the negative z direction of the coordinate system 150. FIG. 1c shows a situation where the plug-in unit 102 has been installed in the frame 101. The plug-in unit 102 has an arrangement according to an embodiment of the invention for indicating correct installation of a plug-in unit. Said arrangement comprises a distance indicator 106 located at the edge 109 of the plug-in unit and adapted to produce an indication for correct installation of the plug-in unit in response to a situation where the distance of the distance indicator from a wall 107 of the frame 101 is smaller than a predetermined threshold value. The distance indicator 106 is an electromechanical limit switch adapted to produce said indication in response to a situation where a first part 110 of said limit switch has contacted the wall 107 of the frame and said first part has traveled a predetermined distance in relation to a second part 111 of said limit switch, which second part is fixed relative to the plug-in unit 102. The distance indicator 106 is thus capable of producing said indication without a need for a galvanically conducted electric current between the distance indicator 106 and frame 101. Information represented by said indication can be output for example by using an indicator light or some other arrangement perceptible to the installer. It is also possible to feed the information represented by said indication into a network management system, for instance. When using the above-described arrangement according to an embodiment of the invention there is no need for electrical circuit arrangements in the frame 101 for indicating correct installation of plug-in units. The above-described arrangement according to an embodiment of the invention can thus also be used in conjunction with telecommunications devices in which there are no such electrical circuit arrangements in the frame.

Figure 2:
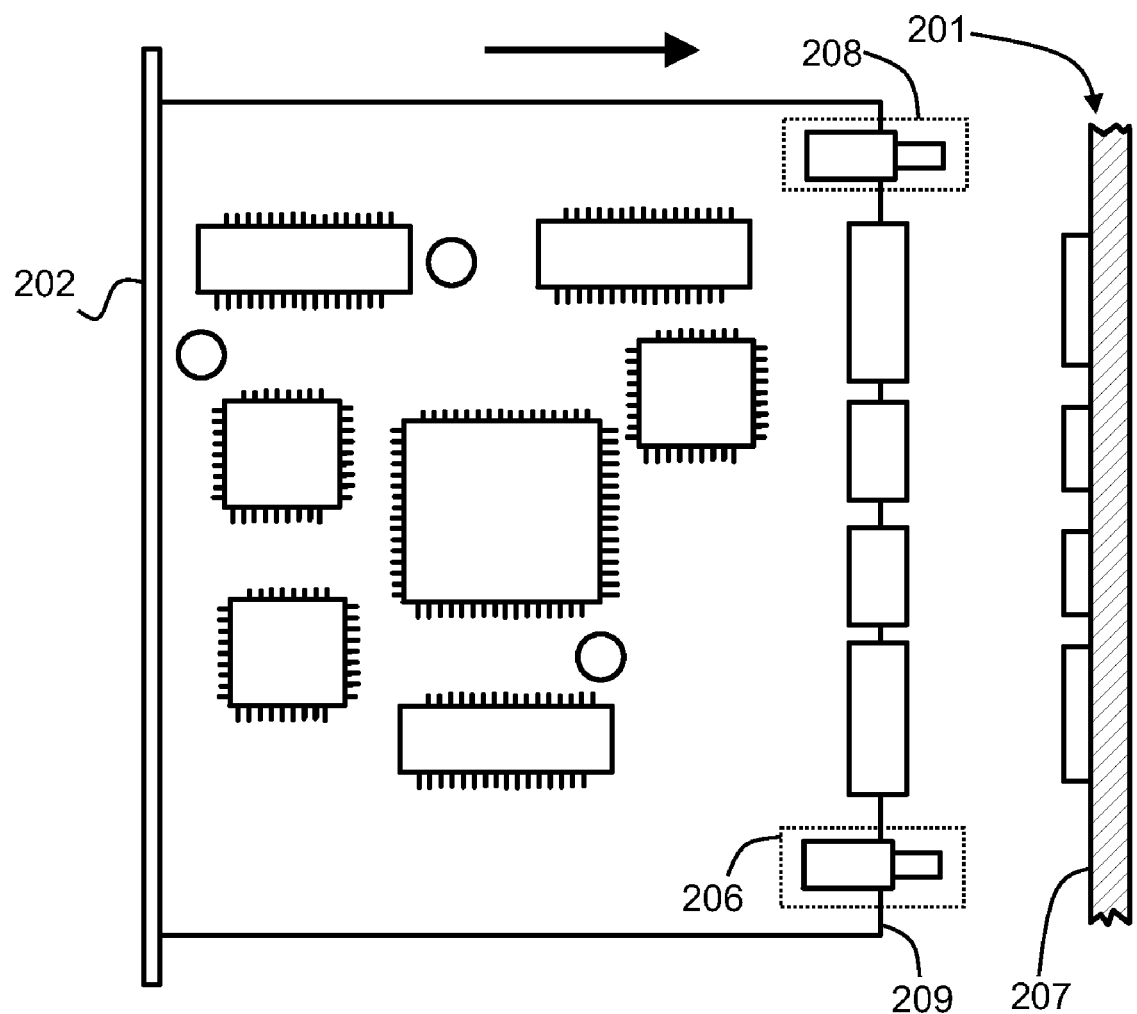
FIG. 2 shows a plug-in unit according to an embodiment of the invention and a detail of the frame of a telecommunications device.

FIG. 2 shows a plug-in unit 202 according to an embodiment of the invention and a detail of a frame 201 of a telecommunications device. The plug-in unit may include processor equipment to handle data communications. Said processor equipment may be adapted to support the functionality of at least one of the following, for example: IP (Internet Protocol) router, ATM (Asynchronous Transfer Mode) switch, Ethernet switch, and MPLS (Multi Protocol Label Switching) switch. The plug-in unit may also be a power supply unit, for example, in which case it might not include processor equipment to handle data communications. The plug-in unit includes distance indicators 206 and 208 which are electromechanical switches located at a distance from each other at opposite ends of the edge 209 of the plug-in unit as shown in FIG. 2. Each distance indicator is adapted to produce an indication for correct installation of the plug-in unit in response to a situation where the distance of the distance indicator from a wall 207 of the frame 201 of said telecommunications device is smaller than a predetermined threshold value. The plug-in unit has an electric circuit adapted to indicate correct installation of said plug-in unit if and only if both distance indicators 206 and 208 indicate correct installation of the plug-in unit. It is also possible to have more than two distance indicators in the plug-in unit.

Figure 3:
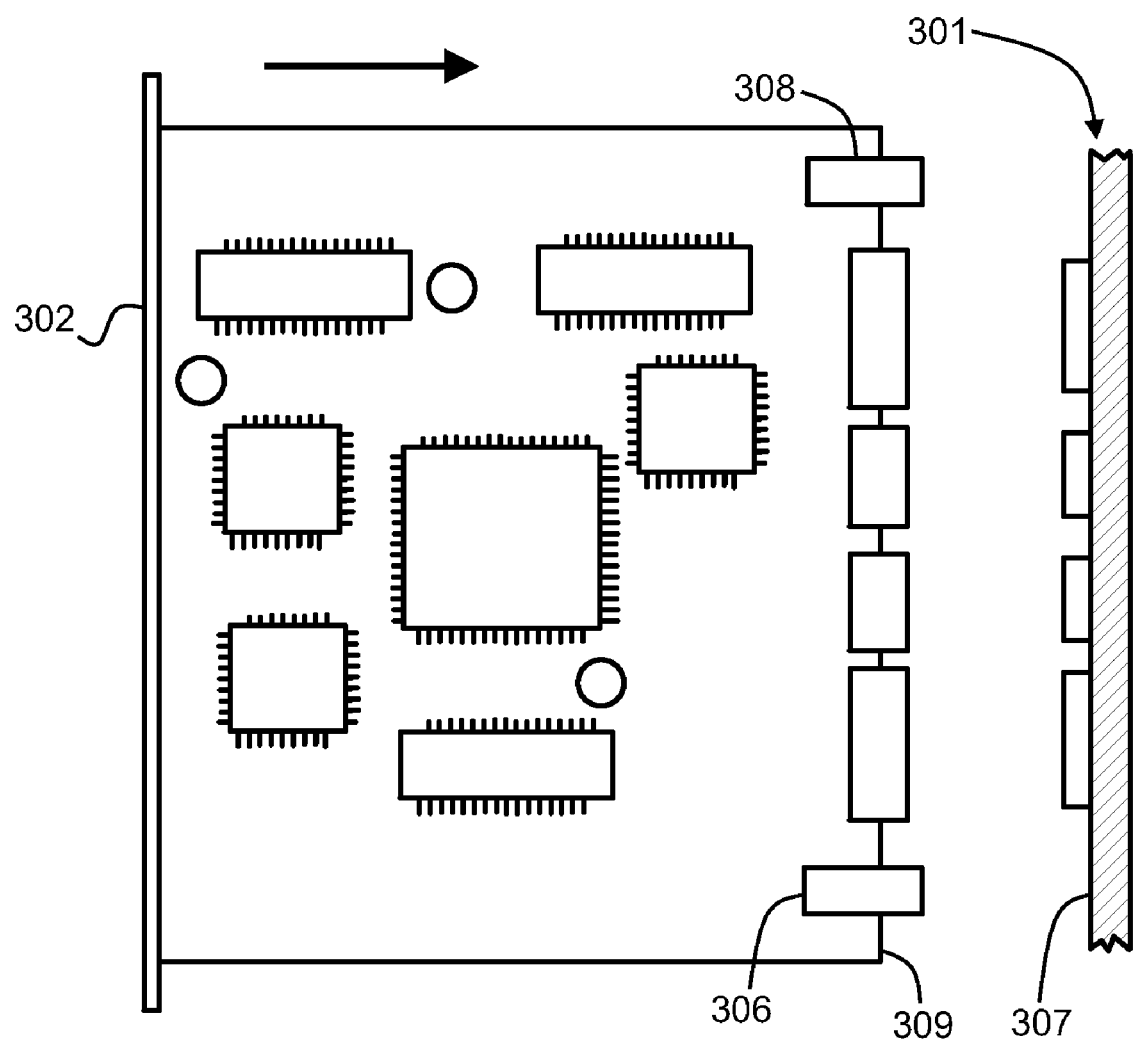
FIG. 3 shows a plug-in unit according to an embodiment of the invention and a detail of the frame of a telecommunications device.

FIG. 3 shows a plug-in unit 302 according to an embodiment of the invention and a detail of a frame 301 of a telecommunications device. The plug-in unit includes distance indicators 306 and 308 which are capacitive distance sensors located at a distance from each other at opposite ends of the edge 309 of the plug-in unit. Each distance indicator is adapted to produce an indication for correct installation of the plug-in unit in response to a situation where the distance of the distance indicator from a wall 307 of the frame 301 of said telecommunications device is smaller than a predetermined threshold value. The plug-in unit has an electric circuit adapted to indicate correct installation of said plug-in unit if and only if both distance indicators 306 and 308 indicate correct installation of the plug-in unit.

The distance indicator in the plug-in unit may also be a magnetic distance sensor, distance sensor based on a beam of light or some other distance sensor suitable for the purpose. A distance sensor based on a beam of light, for instance, need not be located at the edge of the plug-in unit as in the embodiment examples depicted in FIGS. 1b, 1c, 2, and 3.

Figure 4:
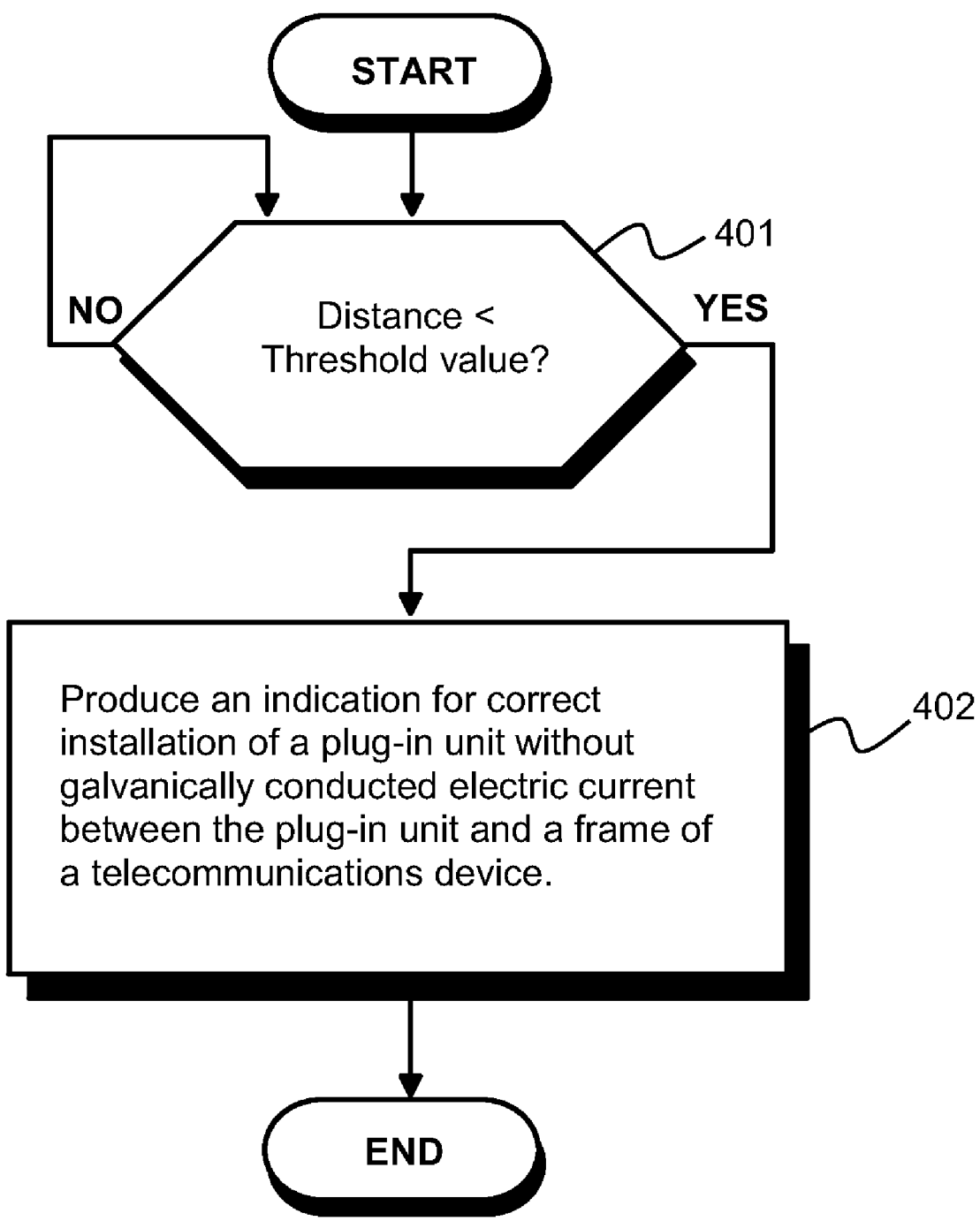
FIG. 4 shows as a flow diagram a method according to an embodiment of the invention for indicating correct installation of a plug-in unit of a telecommunications device.

FIG. 4 shows as a flow diagram a method according to an embodiment of the invention for indicating correct installation of a plug-in unit of a telecommunications device. The method includes step 402 to produce an indication, using at least one distance indicator located in said plug-in unit, for correct installation of said plug-in unit if the distance of said distance indicator from a wall of the frame of said telecommunications device is smaller than a predetermined threshold value, condition step 401. The distance indicator used in the method is capable of producing said indication without a need for a galvanically conducted electric current between the distance indicator and frame of the telecommunications device.

In a method according to an embodiment of the invention the indication is produced by an electromechanical limit switch in response to a situation where the plug-in unit has been pushed towards said wall of the frame of the telecommunications device, a first part of said limit switch has contacted the wall, and said first part has traveled a predetermined distance in relation to a second part of said limit switch, which second part is fixed relative to the plug-in unit.

In a method according to an embodiment of the invention the indication is produced using a capacitive distance sensor.

In a method according to an embodiment of the invention, an indication of correct installation of said plug-in unit is produced if each of the distance indicators, which are located in said plug-in unit at a distance from each other, indicates correct installation of said plug-in unit.

As is obvious to a person skilled in the art, the invention and its embodiments are not limited to the illustrative embodiments described above. Expressions used in the claims describing the existence of characteristic features, such as "the arrangement comprises at least one distance indicator" are non-exclusive such that a mention of a characteristic feature shall not exclude the existence of other characteristic features not mentioned in the independent or dependent claims.

What is claimed is:

1. An arrangement for indicating correct installation of a plug-in unit of a telecommunications device, the arrangement comprising at least one distance indicator located in said plug-in unit and adapted to produce an indication for correct installation of the plug-in unit in response to a situation where the distance of the distance indicator from a wall of a frame of the telecommunications device is smaller than a predetermined threshold value, said distance indicator being capable of producing said indication without a need for a galvanically conducted electric current between said distance indicator and said frame of the telecommunications device, and said predetermined threshold value being chosen such that when the distance indicator produces said indication, reliable galvanic contacts have been formed in electric connectors between said plug-in unit and said frame.

2. An arrangement according to claim 1, wherein said at least one distance indicator is an electromechanical limit switch adapted to produce said indication in response to a situation where said plug-in unit has been pushed towards said wall of the frame of the telecommunications device, a first part of said limit switch has contacted the wall, and said first part has moved in relation to a second part of said limit switch, which second part is fixed relative to the plug-in unit.

3. An arrangement according to claim 1, wherein said at least one distance indicator is a capacitive distance sensor.

4. An arrangement according to claim 1, comprising at least two distance indicators located in said plug-in unit at a distance from each other, and an electric circuit adapted to indicate correct installation of said plug-in unit in response to a situation where each of said at least two distance indicators indicates correct installation of said plug-in unit.

5. A method for indicating correct installation of a plug-in unit of a telecommunications device, the method comprising producing an indication for correct installation of said plug-in unit with the aid of at least one distance indicator located in said plug-in unit in response to a situation where the distance of said distance indicator from a wall of the frame of said telecommunications device is smaller than a predetermined threshold value, said distance indicator being capable of producing said indication without a need for a galvanically conducted electric current between said distance indicator and said frame of the telecommunications device, and said predetermined threshold value being chosen such that when the distance sensor produces said indication reliable galvanic contacts will have been formed in electric connectors between said plug-in unit and said frame.

6. A method according to claim 5, wherein said indication is produced with an electromechanical limit switch in response to a situation where the plug-in unit has been pushed towards said wall of the frame of the telecommunications device, a first part of said limit switch has contacted the wall, and said first part has moved in relation to a second part of said limit switch, which second part is fixed relative to the plug-in unit.

7. A method according to claim 5, wherein said indication is produced with a capacitive distance sensor.

8. A method according to claim 5, wherein an indication of correct installation of said plug-in unit is produced if each of the distance indicators, which are located in said plug-in unit at a distance from each other, indicates correct installation of said plug-in unit.

9. A plug-in unit for a telecommunications device, the plug-in unit comprising at least one distance indicator adapted to produce an indication for correct installation of said plug-in unit in response to a situation where the distance of said distance indicator from a wall of the frame of said telecommunications device is smaller than a predetermined threshold value, said distance indicator being capable of producing said indication without a need for a galvanically conducted electric current between said distance indicator and said frame of the telecommunications device, and said predetermined threshold value being chosen such that when the distance indicator produces said indication, reliable galvanic contacts have been formed in electric connectors between said plug-in unit and said frame.

10. A plug-in unit according to claim 9, wherein said at least one distance indicator is an electromechanical limit switch adapted to produce said indication in response to a situation where said plug-in unit has been pushed towards said wall of the frame of the telecommunications device, a first part of said limit switch has made contact with the wall, and said first part has moved in relation to a second part of said limit switch, which second part is fixed relative to the plug-in unit.

11. A plug-in unit according to claim 9, wherein said at least one distance indicator is a capacitive distance sensor.

12. A plug-in unit according to claim 9, comprising at least two distance indicators located at a distance from each other, and an electric circuit adapted to indicate correct installation of said plug-in unit in response to a situation where each of said at least two distance indicators indicates correct installation of said plug-in unit.

13. A plug-in unit according to claim 9, comprising processor equipment for handling data communications.

14. A plug-in unit according to claim 13, wherein said processor equipment is adapted to support the functionality of at least one of the following: IP (Internet Protocol) router, ATM (Asynchronous Transfer Mode) switch, Ethernet switch, and MPLS (Multi Protocol Label Switching) switch.

15. An arrangement according to claim 2, comprising at least two distance indicators located in said plug-in unit at a distance from each other, and an electric circuit adapted to indicate correct installation of said plug-in unit in response to a situation where each of said at least two distance indicators indicates correct installation of said plug-in unit.

16. An arrangement according to claim 3, comprising at least two distance indicators located in said plug-in unit at a distance from each other, and an electric circuit adapted to indicate correct installation of said plug-in unit in response to a situation where each of said at least two distance indicators indicates correct installation of said plug-in unit.

17. A method according to claim 6, wherein an indication of correct installation of said plug-in unit is produced if each of the distance indicators, which are located in said plug-in unit at a distance from each other, indicates correct installation of said plug-in unit.

18. A method according to claim 7, wherein an indication of correct installation of said plug-in unit is produced if each of the distance indicators, which are located in said plug-in unit at a distance from each other, indicates correct installation of said plug-in unit.

19. A plug-in unit according to claim 10, comprising at least two distance indicators located at a distance from each other, and an electric circuit adapted to indicate correct installation of said plug-in unit in response to a situation where each of said at least two distance indicators indicates correct installation of said plug-in unit.

20. A plug-in unit according to claim 11, comprising at least two distance indicators located at a distance from each other, and an electric circuit adapted to indicate correct installation of said plug-in unit in response to a situation where each of said at least two distance indicators indicates correct installation of said plug-in unit.

* * * * *